(12) United States Patent
Lee

(10) Patent No.: US 11,049,684 B2
(45) Date of Patent: Jun. 29, 2021

(54) FUSE PAD, PRINTED CIRCUIT BOARD HAVING THE FUSE PAD, AND METHOD OF THE PRINTED CIRCUIT BOARD

(71) Applicant: MANDO CORPORATION, Gyeonggi-do (KR)

(72) Inventor: Se Gyun Lee, Gyeonggi-do (KR)

(73) Assignee: MANDO CORPORATION, Gyeonggi-Do (KR)

( * ) Notice: Subject to any disclaimer, the term of this patent is extended or adjusted under 35 U.S.C. 154(b) by 45 days.

(21) Appl. No.: 16/161,104

(22) Filed: Oct. 16, 2018

(65) Prior Publication Data
US 2019/0115182 A1 Apr. 18, 2019

(30) Foreign Application Priority Data
Oct. 17, 2017 (KR) .................. 10-2017-0134549

(51) Int. Cl.
| | | |
|---|---|---|
| H01H 85/30 | (2006.01) | |
| H01H 85/02 | (2006.01) | |
| H01H 85/046 | (2006.01) | |
| H05K 1/02 | (2006.01) | |
| G01R 31/70 | (2020.01) | |
| H05K 3/40 | (2006.01) | |
| H05K 1/11 | (2006.01) | |

(52) U.S. Cl.
CPC .............. *H01H 85/30* (2013.01); *G01R 31/70* (2020.01); *H01H 85/0241* (2013.01); *H01H 85/046* (2013.01); *H05K 1/0268* (2013.01); *H05K 3/4015* (2013.01); *H01H 2085/0266* (2013.01); *H01H 2085/0275* (2013.01); *H01H 2207/012* (2013.01); *H01H 2229/018* (2013.01); *H05K 1/111* (2013.01); *H05K 2201/10181* (2013.01); *H05K 2203/163* (2013.01)

(58) Field of Classification Search
CPC ...... G01R 31/70; H01H 85/30; H01H 85/046; H01H 85/0241; H01H 2229/018; H01H 2085/0266; H01H 2085/0275; H01H 2207/012; H01H 2037/763; H01H 37/761; H05K 1/0268; H05K 3/4015; H05K 2201/10181; H05K 1/111; H05K 2203/163; H05K 1/181; H05K 1/0257
USPC .................................................. 324/763.01
See application file for complete search history.

(56) References Cited

U.S. PATENT DOCUMENTS

| | | | | |
|---|---|---|---|---|
| 3,721,936 A | * | 3/1973 | Belcher ................ | H01H 85/303 337/241 |
| 4,296,398 A | * | 10/1981 | McGalliard .......... | H01H 85/046 337/232 |
| 4,387,358 A | * | 6/1983 | Knapp, Jr. ........... | H01H 85/306 337/244 |
| RE34,174 E | * | 2/1993 | Brown .................... | F25C 1/04 62/135 |
| 5,358,798 A | * | 10/1994 | Kleinert, III ........ | H01M 50/209 429/7 |

(Continued)

FOREIGN PATENT DOCUMENTS

| | | |
|---|---|---|
| JP | 5555764 | 6/2014 |
| KR | 10-2016-0054655 | 5/2016 |

*Primary Examiner* — Christopher P McAndrew
(74) *Attorney, Agent, or Firm* — Ladas & Parry, LLP

(57) ABSTRACT

Disclosed are a fuse pad, a printed circuit board having the fuse pad, and a method of manufacturing the printed circuit board. The fuse pad includes a first pad provided at one side of a fuse, a second pad provided at an opposite side of the fuse, and a measurement pad electrically connected to the second pad to measure whether the fuse is detached.

17 Claims, 8 Drawing Sheets

(a) FUSE AND SECOND PAD IN CONTACT WITH EACH OTHER (b) FUSE AND SECOND PAD IN NO-CONTACT WITH EACH OTHER

(56) References Cited

U.S. PATENT DOCUMENTS

| | | | | |
|---|---|---|---|---|
| 5,726,621 A * | 3/1998 | Whitney | H01H 85/0411 | 337/283 |
| 5,776,371 A * | 7/1998 | Parker | H01H 85/30 | 106/272 |
| 5,994,993 A * | 11/1999 | Castonguay, Jr. | H01H 85/30 | 337/206 |
| 6,373,370 B1 * | 4/2002 | Darr | H01H 85/30 | 116/200 |
| 6,456,189 B1 * | 9/2002 | Mosesian | H01H 85/30 | 116/207 |
| 7,369,030 B2 * | 5/2008 | Darr | H01H 85/30 | 324/550 |
| 7,932,805 B2 * | 4/2011 | Darr | H01H 85/30 | 337/243 |
| 10,147,573 B1 * | 12/2018 | Su | H01H 37/761 | |
| 10,412,826 B2 * | 9/2019 | Zhao | H05K 1/0293 | |
| 2002/0093259 A1 * | 7/2002 | Sunaga | H02K 11/25 | 310/68 R |
| 2002/0196037 A1 * | 12/2002 | Byrd | G01R 31/2886 | 324/754.07 |
| 2003/0048620 A1 * | 3/2003 | Nishimura | H05K 1/0293 | 361/760 |
| 2005/0141164 A1 * | 6/2005 | Bender | H01H 85/0047 | 361/104 |
| 2006/0197647 A1 * | 9/2006 | Whitney | H05K 3/3426 | 337/297 |
| 2006/0214259 A1 * | 9/2006 | Spaunhorst | H01L 24/01 | 257/529 |
| 2006/0273876 A1 * | 12/2006 | Pachla | H05K 1/0201 | 337/140 |
| 2008/0231410 A1 * | 9/2008 | Doljack | H01H 85/30 | 337/206 |
| 2008/0268671 A1 * | 10/2008 | Harris | H01H 85/34 | 439/76.2 |
| 2009/0027821 A1 * | 1/2009 | Colby | H01H 85/0418 | 361/104 |
| 2011/0050386 A1 * | 3/2011 | Schlenker | H05K 1/0263 | 337/407 |
| 2011/0248775 A1 * | 10/2011 | Liu | H01H 37/761 | 327/525 |
| 2013/0200984 A1 * | 8/2013 | Matthiesen | H01H 37/761 | 337/186 |
| 2014/0292472 A1 * | 10/2014 | Qin | H01H 89/00 | 337/5 |
| 2015/0179371 A1 * | 6/2015 | Hashimoto | H01H 85/463 | 200/329 |
| 2015/0318131 A1 * | 11/2015 | Matthiesen | H01H 37/32 | 337/407 |
| 2015/0340181 A1 * | 11/2015 | Ho | H01H 37/761 | 337/407 |
| 2016/0157346 A1 * | 6/2016 | Wu | H05K 1/112 | 174/251 |
| 2016/0194157 A1 * | 7/2016 | Senn | B65G 54/02 | 414/467 |

* cited by examiner (a) FUSE AND SECOND PAD IN CONTACT WITH EACH OTHER (b) FUSE AND SECOND PAD IN NO-CONTACT WITH EACH OTHER (a) FUSE AND SECOND PAD IN CONTACT WITH EACH OTHER (b) FUSE AND SECOND PAD IN NO-CONTACT WITH EACH OTHER (a) FUSE AND SECOND PAD IN CONTACT WITH EACH OTHER (b) FUSE AND SECOND PAD IN NO-CONTACT WITH EACH OTHER

FUSE PAD, PRINTED CIRCUIT BOARD HAVING THE FUSE PAD, AND METHOD OF THE PRINTED CIRCUIT BOARD

CROSS-REFERENCE TO RELATED APPLICATION

This application is based on and claims priority under 35 U.S.C. § 119 to Korean Patent Application No. 2017-0134549, filed on Oct. 17, 2017 in the Korean Intellectual Property Office, the disclosure of which is incorporated herein by reference.

BACKGROUND

1. Field

The present disclosure relates to a fuse pad, a printed circuit board having the fuse pad, and a method of manufacturing the printed circuit board.

2. Description of the Related Art

In general, the conventional fuses have been provided to protect damage to a circuit of a printed circuit board.

For example, Korean Laid-Open Patent Publication No. 10-2016-0054655 (May 17, 2016) discloses a surface mounted thermal fuse and a method of installing the same in which damage to a circuit of a printed circuit board is protected using a thermal fuse.

However, the conventional surface mounted thermal fuse and installation method thereof have limitations in measuring whether the fuse is detached.

The conventional surface mounted thermal fuse and installation method thereof have limitations in improving the efficiency of measurement of whether a fuse is detached, suppressing an increase in the production cost for manufacturing a printed circuit board, and improving the production yield.

Accordingly, in recent years, there have been continuous studies on an improved fuse pad for improving the efficiency of measurement of whether a fuse is detached, suppressing an increase in the production cost for manufacturing a printed circuit board, and improving the production yield, a printed circuit board having the fuse pad, and a method of manufacturing the printed circuit board.

Further, in recent years, there have been continuous studies on an improved fuse pad capable of providing convenience to an operator in manufacturing a printed circuit board, a printed circuit board having the fuse pad, and a method of manufacturing the printed circuit board.

RELATED ART DOCUMENT

Patent Document

Korean Laid-Open Patent Publication No. 10-2016-0054655 (May 17, 2016)

SUMMARY

Therefore, it is an object of the present disclosure to provide a fuse pad capable of improving the efficiency of measurement of whether a fuse is detached, a printed circuit board having the fuse pad, and a method of manufacturing the printed circuit board.

It is another object of the present disclosure to provide a fuse pad capable of improving the production yield while suppressing an increase in the production cost for manufacturing a printed circuit board, a printed circuit board having the fuse pad, and a method of manufacturing the printed circuit board.

It is another object of the present disclosure Provide a fuse pad capable of providing convenience to an operator in manufacturing a printed circuit board, a printed circuit board having the fuse pad, and a method of manufacturing the printed circuit board.

Additional aspects of the invention will be set forth in part in the description which follows and, in part, will be obvious from the description, or may be learned by practice of the invention.

Therefore, it is an aspect of the present invention to provide a fuse pad including: a first pad provided at one side of a fuse; a second pad provided at an opposite side of the fuse; and a measurement pad electrically connected to the second pad to measure whether the fuse is detached.

The second pad may be provided at a portion of the fuse which is fixed.

The second pad may be provided at an outer end portion of the fuse which is fixed.

The second pad may be provided at a central portion of the fuse which is fixed. The second pad may be provided at an inner end portion of the fuse which is fixed.

The measurement pad may be configured to: output a fuse-fixation signal when the fuse and the second pad are in contact with each other; and output a fuse-separation signal when the fuse and the second pad are in no contact with each other.

At least one of the first pad and the second pad may include a solder mask.

The fuse may include a thermal fuse.

It is another aspect of the present invention to provide a printed circuit board including: a substrate material; a first pad provided at one side of a fuse, at one side of the substrate material to protect the one side of the substrate material; a second pad provided at an opposite side of the fuse, at an opposite side of the substrate material to protect the opposite side of the substrate material; and a measurement pad electrically connected to the second pad to measure whether the fuse is detached.

The substrate material may be provided in the form of multi-layer, and the measurement pads are connected to each other through a via hole formed through the substrate material in the form of multi-layer.

The printed circuit board may further include an electronic device to communicate with the measurement pad, wherein the measurement pad may transmit a fuse-fixation signal or a fuse-separation signal to the electronic device such that the electronic device identifies whether the fuse is separated or not.

It is another aspect of the present invention to provide a method of manufacturing a printed circuit board, the method including: forming a first pad and a second pad at one side and an opposite side of a substrate material while protecting the one side and the opposite side of the substrate material; forming a measurement pad to be electrically connected to the second pad to measure whether a fuse is detached; and forming the fuse on the first pad and the second pad.

BRIEF DESCRIPTION OF THE DRAWINGS

These and/or other aspects of the invention will become apparent and more readily appreciated from the following description of the embodiments, taken in conjunction with the accompanying drawings of which.

DETAILED DESCRIPTION

Hereinafter, embodiments of the present invention will be described in detail with reference to the accompanying drawings. The following embodiments are provided to fully convey the spirit of the present invention to a person having ordinary skill in the art to which the present invention belongs. The present invention is not limited to the embodiments shown herein but may be embodied in other forms. In order to make the description of the present invention clear, unrelated parts are not shown and, the sizes of components are exaggerated for clarity.

Figure 1:
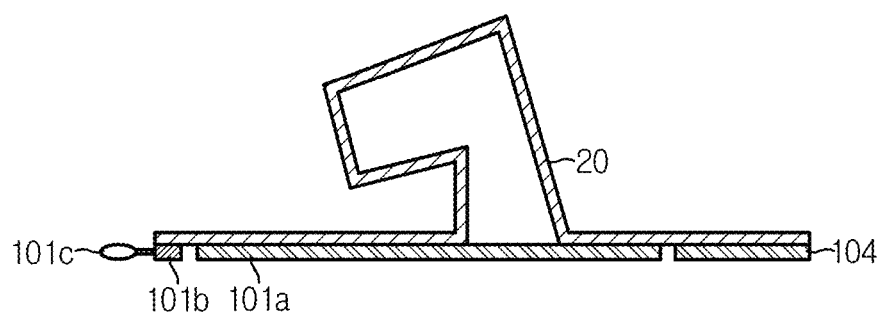
FIG. 1 is a side view illustrating a fuse pad according to an embodiment of the present disclosure.
Figure 1:
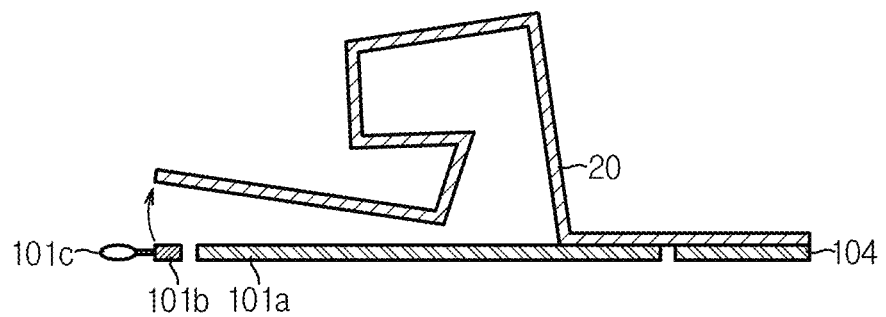
Figure 2:
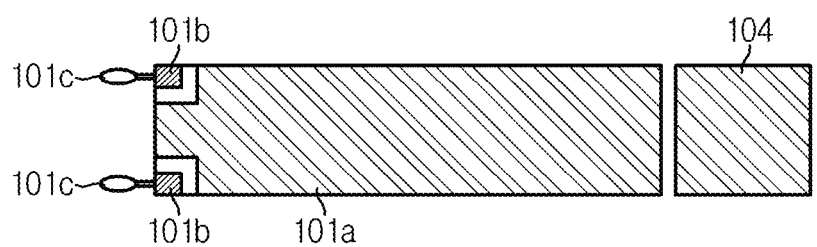
FIG. 2 is a plan view illustrating a first pad, a second pad, and a measurement pad shown in FIG. 1.

FIG. 1 is a side view illustrating a fuse pad according to an embodiment of the present disclosure, and FIG. 2 is a plan view illustrating a first pad, a second pad, and a measurement pad shown in FIG. 1.

Figure 3:
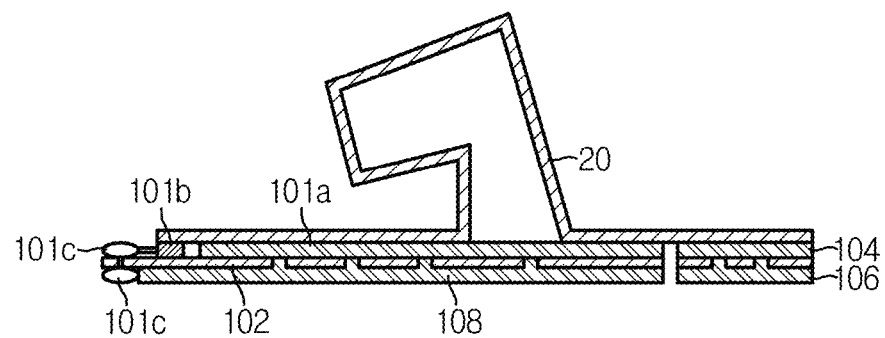
FIG. 3 is a side view illustrating an example of a printed circuit board according to an embodiment of the present disclosure.
Figure 3:
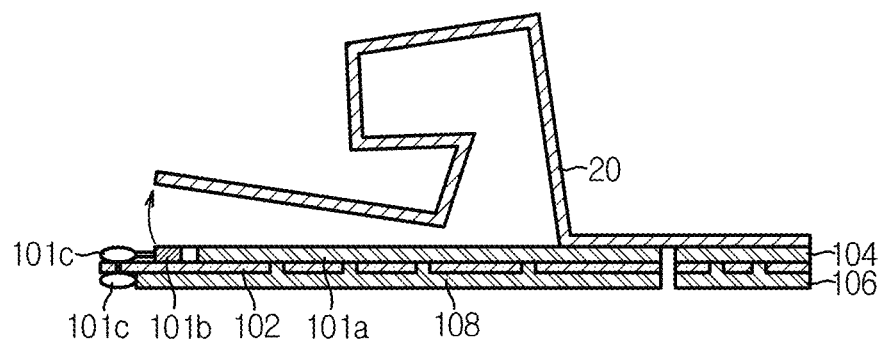
Figure 4:
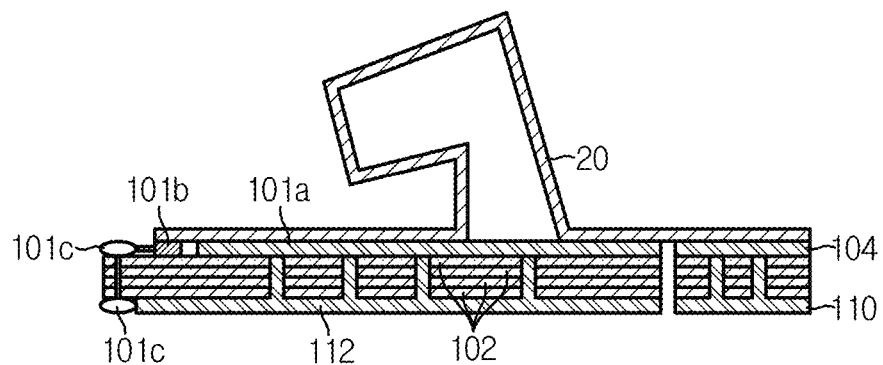
FIG. 4 is a side view illustrating another example of a printed circuit board according to an embodiment of the present disclosure.
Figure 4:
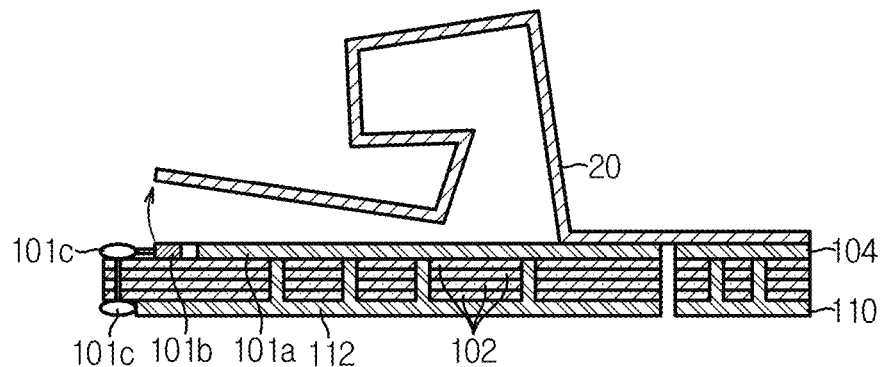

FIG. 3 is a side view illustrating an example of a printed circuit board according to an embodiment of the present disclosure, and FIG. 4 is a side view illustrating another example of a printed circuit board according to an embodiment of the present disclosure.

Figure 5:
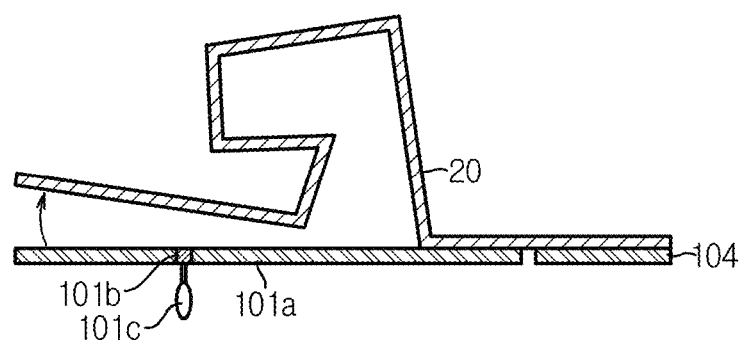
FIG. 5 is a side view illustrating another example of a fuse pad according to an embodiment of the present disclosure.
Figure 6:
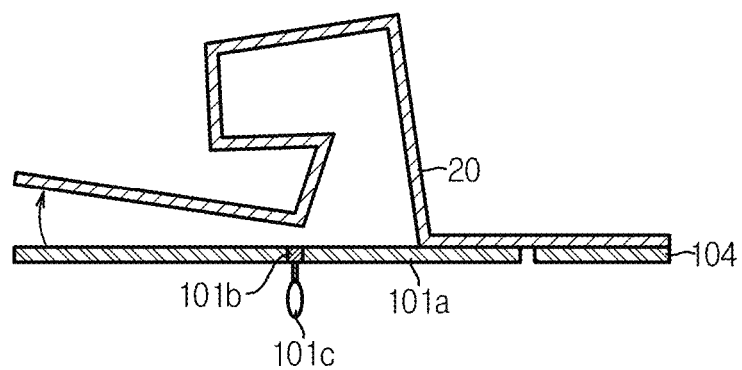
FIG. 6 is a side view illustrating still another example of a fuse pad according to an embodiment of the present disclosure.

FIG. 5 is a side view illustrating another example of a fuse pad according to an embodiment of the present disclosure, and FIG. 6 is a side view illustrating still another example of a fuse pad according to an embodiment of the present disclosure.

Figure 7:
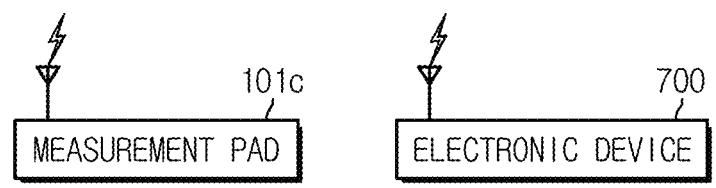
FIG. 7 is a block diagram illustrating a state in which the measurement pad shown in FIGS. 1 to 6 communicates with an electronic device.

FIG. 7 is a block diagram illustrating a state in which the measurement pad shown in FIGS. 1 to 6 communicates with an electronic device shown in FIG. 6.

Referring to FIGS. 1 to 6, a fuse pad according to an embodiment of the present disclosure includes a first pad 101a, a second pad 101b, and a measurement pad 101c.

The first pad 101a is provided at one side of the fuse 20, and the second pad 101b is provided at an opposite side of the fuse 20.

The measurement pad 101c is electrically connected to the second pad 101b to measure whether the fuse 20 is detached.

In this case, the second pad 101b may be provided at a portion of the fuse 20 which is fixed.

As an example, the second pad 101b may be provided at an outer end portion of the fuse 20 which is fixed as shown in FIG. 1.

As another example, the second pad 101b may be provided at a central portion of the fuse 20 which is fixed as shown in FIG. 5.

As still another example, the second pad 101b may be provided at an inner end portion of the fuse 20 which is fixed as shown in FIG. 6.

The measurement pad 101c may output a fuse-fixation signal when the fuse 20 and the second pad 101b are in contact with each other, and output a fuse-separation signal when the fuse 20 and the second pad 101b are in no contact with each other.

For example, the measurement pad 101c may output a fuse-fixation signal when the outer end portion of the fuse 20, which is fixed, and the second pad 101b are in contact with each other, and output a fuse-separation signal when the outer end portion of the fuse 20, which is fixed, and the second pad 101b are in no contact with each other as shown in FIG. 1.

As another example, the measurement pad 101c may output a fuse-fixation signal when the central portion of the fuse 20, which is fixed, and the second pad 101b are in contact with each other, and output a fuse-separation signal when the central portion of the fuse 20, which is fixed, and the second pad 101b are in no contact with each other as shown in FIG. 5.

As another example, the measurement pad 101c may output a fuse-fixation signal when the inner end portion of the fuse 20, which is fixed, and the second pad 101b are in contact with each other, and output a fuse-separation signal when the inner end portion of the fuse 20, which is fixed, and the second pad 101b are in no contact with each other as shown in FIG. 6.

In addition, a third pad 104 may be provided at another side of the fuse 20.

Here, at least one of the first pad 101a, the second pad 101b, and the third pad 104 may include a solder mask, and the fuse 20 may include a thermal fuse.

Referring to FIGS. 3 and 4, a printed circuit board according to an embodiment of the present disclosure includes a substrate material 102, a first pad 101a, a second pad 101b, and a measurement pad 101c.

The first pad 101a is provided at one side of the fuse 20, at one side of the substrate material 102 to protect the one side of the substrate material 102.

The second pad 101b is provided at an opposite side of the fuse 20, at an opposite side of the substrate material 102 to protect the opposite side of the substrate material 102.

The measurement pad 101c is electrically connected to the second pad 101b, and is connected to another measurement pad 101c through a via hole (not shown) of the substrate material 102 (not shown) to measure whether the fuse 20 is separated.

In this case, the second pad 101b may be provided at a portion of the fuse 20 which is fixed.

As an example, the second pad 101b may be provided at an outer end portion of the fuse 20 which is fixed.

As other example, although not shown, the second pad 101b may be provided at a central portion of the fuse 20 which is fixed.

As another example, although not shown, the second pad 101b may be provided at an inner end portion of the fuse 20 which is fixed.

The measurement pad 101c may output a fuse-fixation signal when the fuse 20 and the second pad 101b are in contact with each other, and output a fuse-separation signal when the fuse 20 and the second pad 101b are in no contact with each other.

As an example, the measurement pad 101c may output a fuse-fixation signal when the outer end portion of the fuse 20, which is fixed, and the second pad 101b are in contact with each other, and output a fuse-separation signal when the outer end portion of the fuse 20, which is fixed, and the second pad 101b are in non-contact with each other.

As another example, although not shown, the measurement pad 101c may output a fuse-fixation signal when the central portion of the fuse 20, which is fixed, and the second pad 101b are in contact with each other, and output a fuse-separation signal when the central portion of the fuse 20, which is fixed, and the second pad 101b are not in contact with each other.

As still another example, although not show, the measurement pad 101c may output a fuse-fixation signal when the inner end portion of the fuse 20, which is fixed, and the second pad 101b are in contact with each other, and output a fuse-separation signal when the inner end portion of the fuse 20, which is fixed, and the second pad 101b are in non-contact with each other.

In addition, a third pad 104 may be provided on another side of the fuse 20.

In addition, a fourth pad 106 may be provided on another side of the substrate material 102 corresponding to the third pad 104, and may be further connected to the third pad 104 through a via hole (not shown) of the substrate material 102.

In addition, a fifth pad 108 may be provided on an opposite side of the substrate material 102 corresponding to the first pad 101a, and may be further connected to the first pad 101a through a via hole (not shown) of the substrate material 102.

Here, at least one of the first pad 101a, the second pad 101b, the third pad 104, the fourth pad 106, and the fifth pad 108 may include a solder mask.

The substrate material 120 of the printed circuit board according to an embodiment of the present disclosure may be provided in a multi-layer structure as shown in FIG. 4, and the measurement pad 101c may be further connected to another measurement pad 101c through a via hole (not shown) of the substrate material 102 provided in a multi-layer structure.

In addition, a sixth pad 110 may be provided at another side of the multi-layer substrate material 102 corresponding to the third pad 104, and although not shown, the sixth pad 110 may be further connected to the third pad 104 through a via hole (not shown) of the multi-layer substrate material 102.

In addition, a seventh pad 112 may be provided at an opposite side of the multi-layer substrate material 102 corresponding to the first pad 101a, and although not shown, may be further connected to the first pad 101a through a via hole (not shown) of the multi-layer substrate material 102.

Here, at least one of the sixth pad 110 and the seventh pad 112 may include a solder mask.

Referring to FIG. 7, the measurement pad 101c of the fuse pad 101 according to an embodiment of the present disclosure may further perform communication with an electronic device 700.

That is, the measurement pad 101c may transmit a fuse-fixation signal or a fuse-separation signal to the electronic device 700 such that the electronic device 700 identifies whether the fuse 20 is detached or not.

Here, the electronic device 700 may identify whether the fuse 20 is detached using at least one of a short message service (SMS) message and a pop-up message corresponding to a fuse-fixation signal or a fuse-separation signal.

The communication method between the measurement pad 101c and the electronic device 700 is achieved using any one or combination of a Bluetooth module (not shown) and a Wi-Fi module (not shown), a Zigbee module (not shown) and a Z-Wave, a Wibro module (not shown) and a Wi-Max Module (not shown), a LTE module (not shown) and an LTE Advanced module (not shown), and a Li-Fi module (not shown) and a Beacon module (not shown).

Although not shown, the electronic device 700 may be one of a communication terminal (not shown) and a portable mobile communication terminal (not shown), the communication terminal (not shown) may be a computer (not shown), and the portable mobile communication terminal (not shown) may be any one of a personal digital assistant (PDA) (not shown), a smart phone (not shown), a tablet PC (not shown), a mobile phone (not shown) and a notebook computer (not shown).

Figure 8:
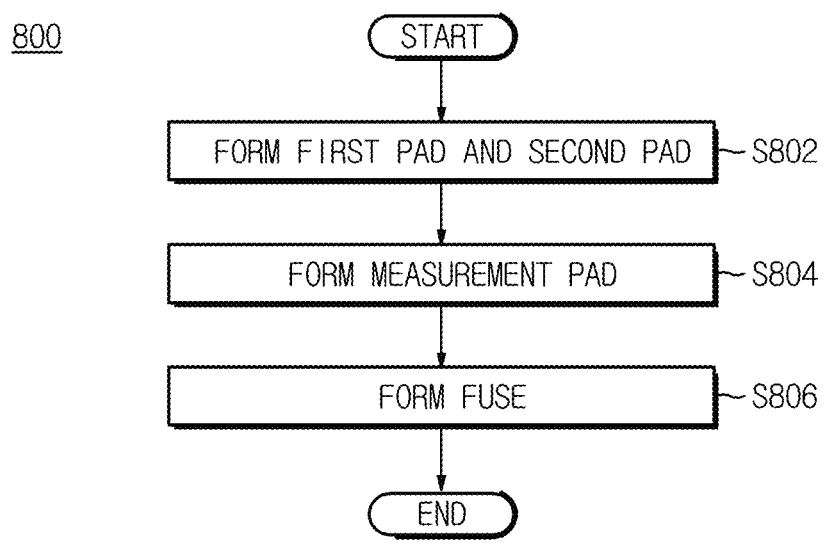
FIG. 8 is a flowchart showing an example of a method of manufacturing a printed circuit board according to an embodiment of the present disclosure.

FIG. 8 is a flowchart showing an example of a method of manufacturing a printed circuit board according to an embodiment of the present disclosure.

Referring to FIG. 8, a method S800 of manufacturing a printed circuit board according to an embodiment of the present disclosure includes a first operation S802, a second operation S804, and a third operation S806.

First, in the first operation S802, the first pad 101a and the second pad 101b are formed on one side and an opposite side of the substrate material 102 to reduce the resistance of the fuse 20 while protecting the one side and the opposite side of the substrate material 102.

In addition, in the first operation S802, a third pad 104 may be formed on another side of the substrate material 102 to protect the other side of the substrate material 102.

Further, in the first operation S802, a fourth pad 106 is formed on another side of the substrate material 102 to protect the other side of the substrate material 102, and is further connected to the third pad 104 through a via hole (not shown) of the substrate material 102.

Further, in the first operation S802, a fifth pad 108 is formed on an opposite side of the substrate material 102 to protect the opposite side of the substrate material 102, and is further connected to the first pad 101a through a via hole (not shown) of the substrate material 102.

Further, in the first operation S802, a sixth pad 110 is formed on another side of the multi-layer substrate material 102 to protect the other side of the multi-layer substrate material 102, and is further connected to the third pad 104 through a via hole (not shown) of the multi-layer substrate material 102.

Further, in the first operation S802, a seventh pad 112 is formed on an opposite side of the multi-layer substrate material 102 to protect the opposite side of the multi-layer substrate material 102, and is further connected to the first pad 101a through a via hole (not shown) of the multi-layer substrate material 102.

Then, in the second operation S804, a measurement pad 101c is formed to be electrically connected to the second pad 101b to measure whether the fuse 20 is detached.

In other words, in the second operation S804, the measurement pad 101c is electrically connected to the second pad 101b, and although not shown, is connected to another measurement pad 101c through a via hole (not shown) of the substrate material 102.

Here, in the second operation S804, the second pad 101b may be formed at a portion of the fuse 20 which is fixed.

As an example, in the second operation S804, the second pad 101b may be formed at the outer end portion of the fuse 20 which is fixed.

As another example, although not shown, in the second operation S804, the second pad 101b may be formed at the central portion of the fuse 20 which is fixed.

As another example, although not shown, in the second operation S804, the second pad 101b may be formed at the inner end portion of the fuse 20 which is fixed.

The measurement pad 101c may output a fuse-fixation signal when the fuse 20 and the second pad 101b are in contact with each other, and output a fuse-separation signal when the fuse 20 and the second pad 101b are in no-contact with each other.

As an example, the measurement pad 101c may output a fuse-fixation signal when the outer end portion of the fuse 20, which is fixed, and the second pad 101b are in contact with each other, and may output a fuse-separation signal when the outer end portion of the fuse 20, which is fixed, and the second pad 101b are in contact with each other.

As another example, although not shown, the measurement pad 101c may output a fuse-fixation signal when the central portion of the fuse 20, which is fixed, and the second pad 101b are in contact with each other, and output a fuse-separation signal when the central portion of the fuse 20, which is fixed, and the second pad 101b are in no-contact with each other.

As another example, although not shown, the measurement pad 101c may output a fuse-fixation signal when the inner end portion of the fuse 20, which is fixed, and the second pad 101b are in contact with each other, and output a fuse-separation signal when the inner end portion of the fuse 20, which is fixed, and the second pad 101b are in no-contact with each other.

Further, in the second operation S804, the measurement pad 101c may be connected to another measurement pad 101c through a via hole (not shown) of the multi-layer substrate material 102.

Further, in the second operation S804, the measurement pad 101c may be formed to communicate with the electronic device 700.

In the second operation S804, a fuse-fixation signal or a fuse-separation signal may be transmitted from the measurement pad 101c to the electronic device 700 such that the electronic device 700 identifies whether the fuse 20 is detached.

Then, in the third operation S806, the fuse 20 is formed on the first pad 101a and the second pad 101b.

In the third operation S806, the fuse 20 may be formed on the third pad 104.

The fuse pad, the printed circuit board having the fuse pad, and the method of manufacturing the printed circuit board (S800) according to the embodiment of the present disclosure include the first pad 101a, the second pad 101b, and the measurement pad 101c, performing the first operation S802, the second operation S804, and the third operation S806.

Accordingly, the fuse pad, the printed circuit board having the fuse pad, and the method of manufacturing the printed circuit board according to the embodiment of the present disclosure may measure whether the fuse 20 is detached, and improve the efficiency of measurement whether the fuse 20 is detached.

In addition, the fuse pad, the printed circuit board having the fuse pad, and the method of manufacturing the printed circuit board according to the embodiment of the present disclosure may measure whether the fuse 20 is detached when the printed circuit board is manufactured.

Accordingly, the fuse pad, the printed circuit board having the fuse pad, and the method of manufacturing the printed circuit board according to the embodiment of the present disclosure may recognize a state in which the fuse 20 is separated due to external factors, and thus improve the production yield while suppressing an increase in the production cost for manufacturing the printed circuit board.

Accordingly, the fuse pad, the printed circuit board having the fuse pad, and the method of manufacturing the printed circuit board according to the embodiment of the present disclosure may identify whether the fuse 20 is detached using the electronic device 700.

Accordingly, the fuse pad, the printed circuit board having the fuse pad, and the method of manufacturing the printed circuit board according to the embodiment of the present disclosure may allow an administrator who manages the electronic device 700 to rapidly recognize a state in which the fuse 20 is separated.

Accordingly, the fuse pad, the printed circuit board having the fuse pad, and the method of manufacturing the printed circuit board according the embodiment of the present disclosure may provide convenience to an operator in manufacturing a printed circuit board, and further improve the production yield while further suppressing the rise of the production cost.

As is apparent from the above, the fuse pad, the printed circuit board having the fuse pad, and the method of manufacturing the printed circuit board can improve the efficiency of measurement of whether a fuse is detached.

The fuse pad, the printed circuit board having the fuse pad, and the method of manufacturing the printed circuit board can improve the production yield while suppressing an increase in the production cost for manufacturing a printed circuit board.

The fuse pad, the printed circuit board having the fuse pad, and the method of manufacturing the printed circuit board can provide convenience to an operator in manufacturing a printed circuit board.

What is claimed is:

1. A fuse pad comprising:
a first pad provided at one side of a fuse;
a second pad provided at an opposite side of the fuse; and
a measurement pad electrically connected to the second pad and disposed away from the fuse to measure whether the fuse is detached.

2. The fuse pad of claim 1, wherein the second pad is provided at a portion of the fuse which is fixed.

3. The fuse pad of claim 1, wherein the second pad is provided at an outer end portion of the fuse which is fixed.

4. The fuse pad of claim 1, wherein the second pad is provided at a central portion of the fuse which is fixed.

5. The fuse pad of claim 1, wherein the second pad is provided at an inner end portion of the fuse which is fixed.

6. The fuse pad of claim 1, wherein the measurement pad is configured to:
output a fuse-fixation signal when the fuse and the second pad are in contact with each other; and
output a fuse-separation signal when the fuse and the second pad are in no contact with each other.

7. The fuse pad of claim 1, wherein at least one of the first pad and the second pad includes a solder mask.

8. The fuse pad of claim 1, wherein the fuse includes a thermal fuse.

9. The fuse pad of claim 1, wherein the measurement pad is disposed on a same plane as the first and/or second pads.

10. The fuse pad of claim 9, wherein the measurement pad is connected with the second pad directly, or connected with the second pad by non-movable connection positioned between the measurement pad and the second pad.

11. A printed circuit board comprising:
a substrate material;
a first pad provided at one side of a fuse, at one side of the substrate material to protect the one side of the substrate material;
a second pad provided at an opposite side of the fuse, at an opposite side of the substrate material to protect the opposite side of the substrate material; and
a measurement pad electrically connected to the second pad and disposed away from the fuse to measure whether the fuse is detached.

12. The printed circuit board of claim 11, wherein the substrate material is provided in the form of multi-layer, and
the measurement pads are connected to each other through a via hole formed through the substrate material in the form of multi-layer.

13. The printed circuit board of claim 11, further comprising an electronic device to communicate with the measurement pad,
wherein the measurement pad transmits a fuse-fixation signal or a fuse-separation signal to the electronic device such that the electronic device identifies whether the fuse is separated or not.

14. The printed circuit board of claim 11, wherein the measurement pad is disposed on a same plane as the first and/or second pads.

15. The printed circuit board of claim 11, wherein the measurement pad is disposed below the first and/or second pads.

16. The printed circuit board of claim 14, wherein the measurement pad is connected with the second pad directly, or connected with the second pad by non-movable connection positioned between the measurement pad and the second pad.

17. A fuse pad comprising:
a first pad provided at one side of a fuse;
a second pad provided at an opposite side of the fuse; and
a measurement pad electrically connected to the second pad and disposed away from the fuse to measure whether the fuse is detached
wherein the measurement pad is disposed below the first and/or second pads.

* * * * *